Jan. 23, 1973 R. F. BARTON 3,712,989
PEAK DETECTOR
Filed Sept. 1, 1970
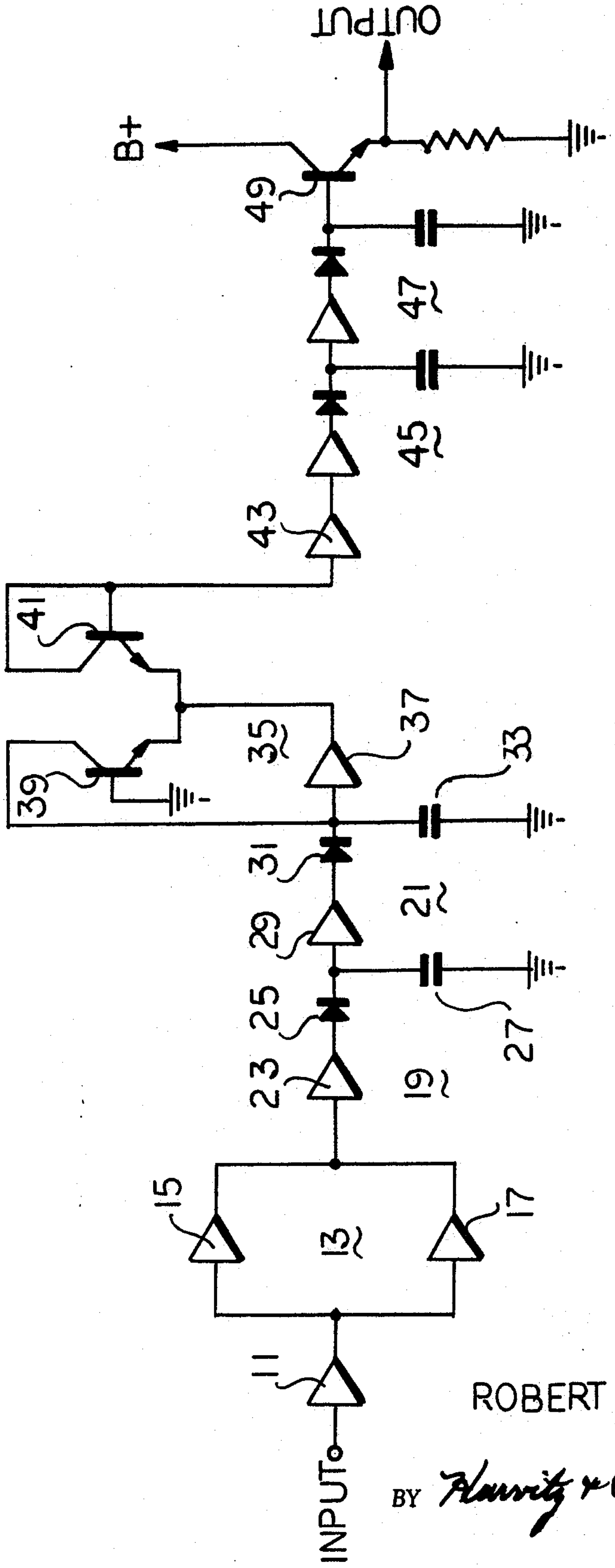
INVENTOR
ROBERT F. BARTON
BY Hurvitz & Rose
ATTORNEYS United States Patent Office 3,712,989

Patented Jan. 23, 1973

3,712,989

PEAK DETECTOR

Robert F. Barton, Annandale, Va., assignor to Gautney & Jones, Falls Church, Va.

Filed Sept. 1, 1970, Ser. No. 68,629
Int. Cl. H03k *9/02, 17/00*
U.S. Cl. 307—235 4 Claims

ABSTRACT OF THE DISCLOSURE

A logarithmic peak detector operable over wide amplitude and frequency ranges comprises a full-wave rectifier followed by a peak detector circuit which in turn drives a logarithmic amplifier. Full-wave rectification prior to logarithmic amplification reduces by one-half the dynamic range required of the logarithmic amplifier. Peak detection prior to logarithmic amplification considerably reduces the frequency response required of the logarithmic amplifier. The logarithmic peaks may be stored in additional peak detector circuitry for time periods required by the monitoring equipment.

BACKGROUND OF THE INVENTION

The present invention relates to logarithmic peak detector circuits having wide dynamic range and frequency responses, and more particularly to such detectors wherein the dynamic range and frequency response of the logarithmic amplifier may be considerably less than required for the overall detector circuit.

The measurement of noise peaks requires a peak detector circuit capable of wideband (for example, DC to several megahertz) and wide dynamic range (for example, ±60 db) operation. In the prior art, such peak detectors have employed logarithmic amplifiers to drive the peak detection circuitry. However, the difficulty in this approach is the severe requirements imposed upon the logarithmic amplifier. For example, in order to respond to noise peaks of 0.1 microsecond duration or less, the response of the amplifier must be flat over a relatively wide frequency range. Moreover, the amplifier must be capable of logarithmically amplifying input signals over an extremely wide range of input amplitudes (120 db range for ±60 db peak detection). True logarithmic amplification over so large a dynamic range is difficult to achieve, even more so when required over a wide range of frequencies.

It is therefore an object of the present invention to provide a logarithmic peak detector wherein the dynamic amplitude range and frequency response required for the logarithmic amplifier are considerably less stringent than required for the detector as a whole.

SUMMARY OF THE INVENTION

In accordance with the principles of the present invention the signal having peaks to be monitored is applied to a full-wave rectifier and in turn to a two-stage peak detector circuit. The latter provides the signal which drives the logarithmic amplifier. Full-wave rectification prior to log amplification reduces the dynamic range requirements of the log amplifier by one-half. Peak detection prior to log amplification reduces the frequency pass band requirements of the logarithmic amplifier quite drastically.

The full-wave rectifier employs two operational amplifiers, one for negative peaks and one for positive peaks, so that these amplifiers are also required to have a dynamic range no greater than one-half the dynamic range of the overall peak detector circuit.

The logarithmic peaks are stored in further peak detection circuits for a time period required by the monitoring equipment.

BRIEF DESCRIPTION OF THE DRAWING

The above and still further objects, features and advantages of the present invention will become apparent upon consideration of the following detailed description of one specific embodiment thereof, especially when taken in conjunction with the accompanying drawings, wherein:

The figure is a schematic diagram of the peak detector of the present invention.

DESCRIPTION OF THE PREFERRED EMBODIMENT

Referring to the drawing, an input signal to be monitored is applied to a high impedance amplifier 11 employed to eliminate loading by the peak detector on the circuit being monitored. High impedance amplifier 11 may, for example, comprise a dual gate MOS FET (metal oxide semiconductor field effect transistor). The output signal from amplifier 11 is applied to a full-wave rectifier circuit 13 comprising a pair of parallel connected operational amplifiers 15, 17. Amplifier 15 is biased to amplify only positive signals and provides a positive output signal. Amplifier 17 is biased to amplify only negative signals but provides a phase inversion whereby it too provides a positive output signal. The gain of amplifiers 15 and 17 are equal so that the output signal from the full-wave rectifier 13 is a positive signal of amplitude corresponding to the absolute value of the amplitude of the input signal. Details of the amplifiers and biasing circuits in rectifier 13 may take the form illustrated at page 149 of the "Linear Integrated Circuits Applications Handbook" published by Fairchild Semi Conductor and having Library of Congress #67–27446.

The output signal from rectifier 13 is applied to two series-connected peak detector stages 19, 21. Peak detector 19 includes an amplifier 23, diode 25, and capacitor 27 connected in series between the output terminal of rectifier 13 and ground. Peak detector 21 includes an amplifier 29, diode 31 and capacitor 33 connected in series across capacitor 27. Diodes 25 and 31 are poled to conductive positive signals provided by rectifier 13. The output signal provided by peak detector 21 appears across capacitor 33 and is at an amplitude representative of the peak value of the output signal provided by rectifier 13.

The output signal from peak detector 21 is applied to logarithmic amplifier circuit 35. The latter includes an operational amplifier 37 having its input terminal connected to receive the output signal from peak detector 21. The output terminal of operational amplifier 37 is connected in common to the emitters of two matched NPN transistors 39, 41 connected in differential amplifier configuration. The base of transistor 39 is grounded and the collector is connected to the input terminal of operational amplifier 37. The base and collector of transistor 41 are connected together to comprise the output terminal for log amplifier 35. Circuit details for the log amplifier may be found at page 151 of the aforementioned "Linear Integrated Circuits Applications Handbook," with the exception that Fairchild Operational Amplifier Model 702 is employed instead of Model 709 for amplifier 37.

The output signal from log amplifier 35 is further amplified by amplifier 43 and passed through two series-connected peak detector stages 45, 47 of the same general configuration as peak detector stages 19, 21. The purpose of peak detectors 45, 47 is to store the log peaks provided by log amplifier 35 for a period of time required by external recording or monitoring equipment. Coupling of the output signal from peak detector 47 to external equipment is effected via emitter follower circuit 49.

Importantly, the interposition of the full-wave rectifier circuit 13 prior to the log amplifier 35 reduces the dynamic range requirements of the log amplifier by one-half as compared to the requirements for such an amplifier employed without prior rectification as in the prior art. Specifically, since all negative peaks are converted to positive by rectifier 13, the dynamic range of log amplifier 35 need not include the negative portion of dynamic range required to the overall detector. Moreover, since the rectified signals are smoothed considerably by peak detector 19, 21, the frequency response required of log amplifier is greatly minimized.

The log amplifier itself utilizes matched transistors to provide true logarithmic conversion without distortion as might be produced by transistor junction variations.

While I have described and illustrated one specific embodiment of my invention, it will be clear that variations of the details of construction which are specifically illustrated and described may be resorted to without departing from the true spirit and scope of the invention as defined in the appended claims.

I claim:

1. A peak detector circuit, comprising:

a full-wave rectifier arranged to receive input signals having amplitude peaks to be detected and providing unipolar signals of amplitude representative of the absolute value of the input signal amplitude;

a peak detector circuit for receiving said unipolar signals and providing a signal level representative of peak values of the amplitude of said unipolar signals; and a logarithmic amplifier for amplifying said signal level according to a logarithmic function;

wherein said full-wave rectifier includes a pair of parallel-connected amplifiers having the same gain, one of said amplifiers being biased to amplify only positive input signals and the other being biased to amplify only negative input signals with a phase inversion such that both amplifiers provide positive output signals at a common output terminal.

2. The circuit according to claim 1 wherein said logarithmic amplifier comprises:

an operational amplifier havving an input terminal and an output terminal;

means connecting said signal level to said input terminal;

first and second matched transistors of like conductivity, each having a base, emitter and collector electrode;

means connecting said output terminal to the emitter electrode of both of said transistors;

means connecting the collector electrode of said first transistor to said input terminal;

means connecting the base electrode of said first transistor to a reference potential; and means connecting the base and collector electrodes of said second transistor together to define the output terminal of said logarithmic amplifier.

3. A peak detection circuit consisting of a single signal channel in which detection of input signal amplitude peaks is performed over the entire range of input signal amplitudes, said single signal channel comprising:

a logarithmic amplifier responsive to a signal applied thereto for providing an output signal having an amplitude which is logarithmically related to the amplitude of said applied signal;

amplitude compression means for limiting the range of input signals applied to said logarithmic amplifier, said amplitude compression means comprising a full wave rectifier arranged to receive said input signals and provide unipolar signals having amplitudes representative of the absolute values of the input signal amplitude;

further means for limiting the range of signal frequencies applied to said logarithmic amplifier, said further means comprising peak detection means arranged to receive said unipolar signals and provide smoothed signal having an amplitude corresponding to the peak amplitude of said unipolar signal; and means for applying said smoothed signal to said logarithmic amplifier.

4. The circuit according to claim 3 further comprising a peak detector circuit for storing the output signal from said logarithmic amplifier.

References Cited

UNITED STATES PATENTS

| | | | |
|---|---|---|---|
| 3,435,353 | 3/1969 | Sauber | 328—145 |
| 2,600,423 | 6/1952 | Nolle | 328—145 X |
| 2,448,718 | 9/1948 | Koulicovitch | 328—150 |
| 3,535,550 | 10/1970 | Kang | 328—150 |
| 3,255,417 | 6/1966 | Gottlieb | 328—145 |
| 3,248,560 | 4/1966 | Leonard | 328—150 |

HERMAN KARL SAALBACH, Primary Examiner

U.S. Cl. X.R.

307—229; 328—145, 150